(12) United States Patent
Herkommer et al.

(10) Patent No.: US 7,486,707 B2
(45) Date of Patent: Feb. 3, 2009

(54) OPTICAL DELAY MODULE FOR LENGHTENING THE PROPAGATION PATH OF A LIGHT BEAM AND PULSE MULTIPLICATION OR ELONGATION MODULE

(75) Inventors: Alois Herkommer, Aalen (DE); Holger Muenz, Aalen (DE)

(73) Assignee: Carl Zeiss Laser Optics GmbH (DE)

( * ) Notice: Subject to any disclaimer, the term of this patent is extended or adjusted under 35 U.S.C. 154(b) by 177 days.

(21) Appl. No.: 11/013,189

(22) Filed: Dec. 15, 2004

(65) Prior Publication Data
US 2005/0127184 A1 Jun. 16, 2005

Related U.S. Application Data

(60) Provisional application No. 60/529,721, filed on Dec. 15, 2003.

(51) Int. Cl.
*H01S 3/10* (2006.01)
(52) U.S. Cl. .............................. 372/25; 372/26; 372/57; 235/454
(58) Field of Classification Search ............ 235/462.37, 235/462.22, 454, 455; 372/25, 26, 57
See application file for complete search history.

(56) References Cited

U.S. PATENT DOCUMENTS 3,437,954 A 4/1969 Herriott et al.

(Continued)

FOREIGN PATENT DOCUMENTS

DE 1281067 10/1968

(Continued)

OTHER PUBLICATIONS

Herriott, Donald R et al. Folded Optical Delay Lines, Applied Optics, vol. 4, No. 8, Aug. 1965, 7 Pages.

*Primary Examiner*—Ahshik Kim
(74) *Attorney, Agent, or Firm*—St. Onge Steward Johnston & Reens LLC

(57) ABSTRACT

The invention relates to an optical delay module for lengthening the propagation path of a light beam comprises a first spherical mirror and a second spherical mirror, the first spherical mirror and the second spherical mirror having equal radii of curvature, the first and the second mirror being arranged on a common axis of symmetry with concave sides of the first and second mirrors being situated opposite one another at a distance from one another which corresponds to the radii of curvature of the first and second mirrors. The module also includes a coupling-in area for coupling the light beam into a space between the first and second mirrors and a coupling-out area for coupling the light beam out of the space between the first and second mirrors. The propagation path of the light beam between the coupling-in area and the coupling-out area corresponding at least approximately to quadruple the mirror distance, at least one optical arrangement arranged between the first and second mirrors, the optical arrangement being arranged to transfer the light beam between the first and second mirrors in such a way that the propagation path of the light beam without masking out of beam parts between the coupling-in area and the coupling-out area corresponds approximately to 2N times the mirror distance, where N is an integer >2.

26 Claims, 5 Drawing Sheets

U.S. PATENT DOCUMENTS

| | | | |
|---|---|---|---|
| 5,162,940 A * | 11/1992 | Brandelik | 359/333 |
| 5,661,748 A * | 8/1997 | Zahavi et al. | 372/108 |
| 6,067,311 A * | 5/2000 | Morton et al. | 372/57 |
| 6,389,045 B1 * | 5/2002 | Mann et al. | 372/25 |
| 6,535,531 B1 * | 3/2003 | Smith et al. | 372/25 |
| 6,549,267 B1 | 4/2003 | Kudo | 355/53 |
| 6,704,340 B2 * | 3/2004 | Ershov et al. | 372/58 |
| 6,928,093 B2 * | 8/2005 | Webb et al. | 372/25 |
| 7,035,012 B2 * | 4/2006 | Govorkov et al. | 359/618 |
| 7,184,216 B2 * | 2/2007 | Govorkov et al. | 359/618 |
| 2005/0105579 A1 * | 5/2005 | Smith et al. | 372/55 |
| 2005/0264785 A1 * | 12/2005 | Albert | 355/67 |

FOREIGN PATENT DOCUMENTS

| | | |
|---|---|---|
| DE | 199 31 751 A1 | 1/2001 |
| EP | 1 069 453 A2 | 1/2001 |

* cited by examiner

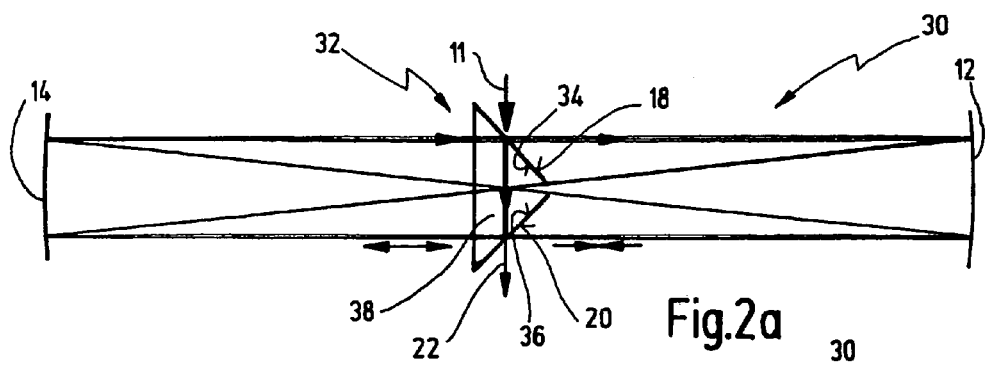
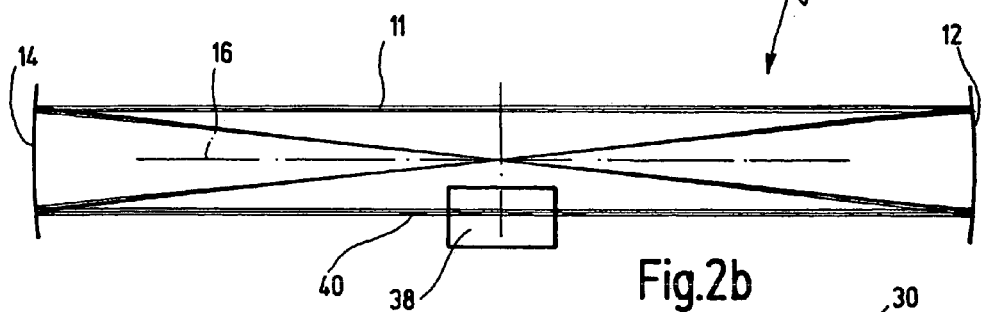
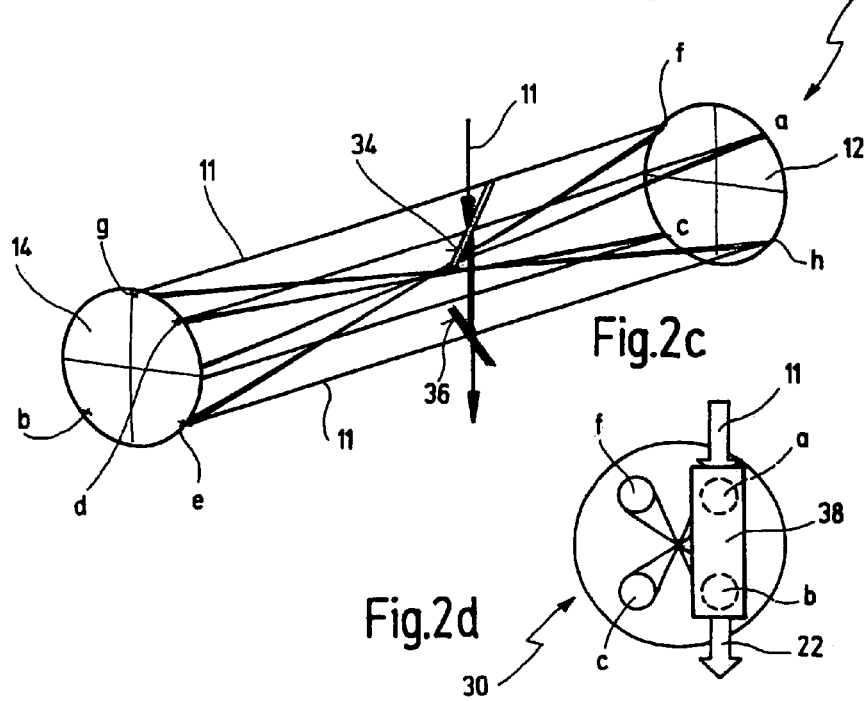

OPTICAL DELAY MODULE FOR LENGHTENING THE PROPAGATION PATH OF A LIGHT BEAM AND PULSE MULTIPLICATION OR ELONGATION MODULE

PRIOR APPLICATION

Applicants claim priority benefits under 35 U.S.C. §119(e) of U.S. Provisional Patent Application Ser. No. 60/529,721 filed Dec. 15, 2003.

BACKGROUND OF THE INVENTION

The invention relates to an optical delay module for lengthening the propagation path of a light beam.

The invention furthermore relates to an optical pulse multiplication or elongation module, having at least one beam splitter area, and having at least one beam combining area, and having an optical delay module of the aforementioned type.

A delay module and also a pulse multiplication or elongation module are disclosed in the document U.S. Pat. No. 5,661,748.

Delay modules and pulse multiplication or elongation modules of this type are used for example in optical beam guiding systems for semiconductor lithography. By way of example, excimer lasers that generate pulsed laser light are used as light sources in semiconductor lithography. Lasers of this type generate temporally short laser pulses, the individual length of which is approximately a few 10 ns, while the energy of the individual laser pulses is usually greater than 5 mJ. This means that the power density of the laser light is very high over the duration of an individual pulse.

These high power densities can damage downstream optical systems, for example a lithography system, or the optical components of a beam guiding system or at least shorten the service life thereof.

In order to solve the problem of the high peak powers within a laser pulse, it has therefore been proposed to divide the light beam coming from the laser into two partial beams by means of a beam splitter device and to allow one partial beam to pass through a delay module and subsequently to recombine the non-delayed light beam and the delayed light beam. In this way, it is possible to increase the pulse duration of the laser pulses, or to split each laser pulse into a plurality of temporally offset subpulses in order thus to lower the power density of each individual pulse or to reduce the peak power of the individual pulses.

The light beam generated by the laser naturally has a divergence, which has to be taken into account in pulse multiplication or elongation modules. In the case of a propagation path difference between the delayed partial beam and the non-delayed partial beam of several meters to a few tens of meters, the divergence of the light beam has the effect that the delayed partial beam has a significantly larger cross section than the non-delayed partial beam. This may have the effect that part of the light is masked out at the periphery of the light beam by optical systems arranged downstream and can thus no longer be used.

Furthermore, it is desirable for the delayed partial beam and the non-delayed partial beam or the subpulses and the original pulse all to lie on one optical axis and, as already mentioned, to have identical beam properties.

In previous delay modules and pulse multiplication or elongation modules, use is made of imaging optics that image the input of the delay module 1:1 onto the output of the delay module.

In the case of a delay module and pulse multiplication or elongation module disclosed in the document EP 1 069 453 A2 the detour line is formed by a plurality of plane mirrors, a refractive imaging optic in the form of a slightly detuned Kepler telescope being used as imaging optic for a 1:1 imaging of the input onto the output of the module. An arrangement comparable therewith is disclosed in the document U.S. Pat. No. 6,549,267 B1.

Such a pulse multiplication or elongation module has the disadvantage that the delay module requires a correspondingly large number of mirrors and optical imaging elements which all have to be separately adjusted exactly and, in addition, be correspondingly held mechanically. This makes the optical system complex, which leads to considerable costs in the production of the system and a considerable expenditure of time in adjusting the system.

In principle, in the case of the pulse multiplication or elongation module in accordance with the document U.S. Pat. No. 5,661,748 already cited in the introduction, this problem is avoided in principle by the delay module having two spherical mirrors, the radii of curvature of which are identical, and which are arranged on the common axis of symmetry with their concave sides situated opposite one another at a mirror distance from one another which approximately corresponds to the radius of curvature of the mirrors.

Through the use of two confocal spherical mirrors, the refractive imaging optic present in the known system mentioned previously can be dispensed with since the spherical mirrors already ensure a 1:1 imaging of the coupling-in area onto the coupling-out area.

In the case of this known pulse multiplication or elongation module, a beam splitter having alternately reflective and transmissive regions is used for coupling the light beam into the space between the two spherical mirrors. In this way, from the light beam coming from the laser, a totality of first beam parts spaced apart from one another are transmitted and a totality of second beam parts are coupled into the delay module. The totality of the coupled-in beam parts circulate four times in total between the two spherical mirrors and are then slightly axially offset by a beam offset plate in order then to be coupled out from the delay module by the beam splitter having the alternate transmissive and reflective sections. The delay of the totality of the coupled-in partial beams with respect to the totality of the non-coupled-in partial beams is thus essentially limited to quadruple the distance. In principle, although it would be possible to obtain greater delay lengths, further and further beam parts would always be masked out in this case, with the result that, given multiple complete circulation cycles, the light intensity decreases rapidly or the shape of the light beam is altered.

Moreover, owing to the alternately transmissive and alternately reflective beam splitter or coupling-in element, the known delay module and pulse multiplication or elongation module are tolerance-sensitive because the special beam splitter has to be adjusted exactly in relation to the offset plate, which disadvantageously increases the adjustment outlay of this known system.

SUMMARY OF THE INVENTION

The invention is based on the object of developing a delay module and a pulse multiplication or elongation module of the types mentioned in the introduction to the effect that, with a compact design, it is possible to realize large delay distances and the adjustment outlay of the system is as low as possible in this case.

According to an aspect of the invention, an optical delay module for lengthening the propagation path of a light beam comprises a first spherical mirror and a second spherical mirror, the first spherical mirror and the second spherical mirror having equal radii of curvature, the first and the second mirror being arranged on a common axis of symmetry with concave sides of the first and second mirrors being situated opposite one another at a mirror distance from one another which corresponds to the radii of curvature of the first and second mirrors, a coupling-in area for coupling the light beam into a space between the first and second mirrors, and a coupling-out area for coupling the light beam out of the space between the first and second mirrors, the propagation path of the light beam between the coupling-in area and the coupling-out area corresponding at least approximately to quadruple the mirror distance, at least one optical arrangement arranged between the first and second mirrors, the optical arrangement being arranged to transfer the light beam between the first and second mirrors in such a way that the propagation path of the light beam without masking out of beam parts between the coupling-in area and the coupling-out area corresponds approximately to 2 N times the mirror distance, where N is an integer >2.

According to another aspect of the invention, a pulse multiplication or elongation module is provided, comprising an optical delay module as mentioned before.

According to another aspect of the invention, a semiconductor lithography system is provided, comprising an optical delay module and/or a pulse multiplication or elongation module as mentioned according to one of the afore-mentioned aspects of the present invention.

The optical arrangement present, according to the invention, between the two spherical mirrors may be realized by reflective and/or refractive elements that have the effect that the light beam coupled into the delay module passes back and forth more than four times between the two spherical mirrors. According to the invention, it is thus possible to realize delay lengths of a multiple of double the mirror distance, for example the mirror distance times six, times eight or more. The delay module according to the invention is tolerance-insensitive and thus convenient for adjustment. Moreover, it is always ensured that the coupled-in light beam is imaged 1:1 onto the coupled-out light beam, this being ensured by the two spherical mirrors spaced apart by the distance of their radius. The delay module according to the invention is of very compact construction, the maximum dimension being determined by the fixed distance between the two spherical mirrors. In combination with a beam splitter area and a beam combining area, it is possible, with the delay module according to the invention, correspondingly to provide a compact, adjustment-insensitive pulse multiplication or elongation module.

In preferred refinements, which can be employed alternatively or cumulatively, the optical arrangement transfers the coupled-in light beam in such a way that the light beam is reflected at the first and the second mirror at in each case at least three different locations. The optical arrangement may preferably transfer the light beam in such a way that the light beam is reflected at each mirror at at least three different locations which lie on a straight line, or at at least three different locations which do not lie on a straight line. A three-dimensional beam folding is achieved in the latter case.

Generally, the optical arrangement preferably has optically active areas which axially offset the light beam at least once with reversal of the propagation direction of the light beam, and/or which transfer the light beam at least once with maintenance of the propagation direction in an axially offset manner.

With the optical delay module according to the invention, it is possible, in particular, to utilize the entire area of the two spherical mirrors for the beam folding, which is achieved by means of the optical arrangement provided according to the invention.

In a preferred refinement, the optical arrangement of the delay module has at least two reflective areas which are arranged relative to one another in such a way that the light beam is retroreflected with an axial offset.

This may be realized, in a preferred refinement, by virtue of the fact that the at least two at least partially reflective areas are at an angle of approximately 90° with respect to one another.

Such an optical arrangement creates a delay module whose delay length is approximately eight times the mirror distance; that is to say, with only two reflective areas that are at an angle of approximately 90° with respect to one another, it is possible to double the delay length in comparison with the known delay module.

It is particularly preferred for the optical arrangement to have at least one 90° prism whose two catheti have reflective areas.

The particular advantage of this measure consists in the fact that the optical arrangement for obtaining a delay length that corresponds approximately to eight times the mirror distance requires only one optical component, the further advantage consisting in the fact that the 90° angle of the two reflective areas is fixed and does not require any adjustment.

In this case, it is furthermore preferred for the hypotenuse of the prism to be perpendicular to the incident and emerging light beam.

In this case, it is advantageous that the light beam incident or emerging through the hypotenuse is not refracted at the hypotenuse, with the result that beam deflection on account of refraction does not occur.

As an alternative to a prism having retroreflective properties, the at least two reflective areas may also be formed by at least two mirrors.

Furthermore, it is preferred for the coupling-in area to be formed by the rear side of one reflective area and/or for the coupling-out area to be formed by the rear side of the at least one second reflective area of the optical arrangement.

This measure has the advantage that the optical arrangement comprising the at least two reflective areas at the same time can also perform the function of coupling the light beam coming from the laser into the delay module and coupling the delayed light beam out of the delay module, as a result of which the number of optical elements and thus the costs and the adjustment outlay of the delay module can be reduced further. By way of example, in connection with one of the aforementioned refinements, the 90° prism may have the coupling-in area and coupling-out area at the outer sides of the two catheti.

In a further preferred refinement, the optical arrangement has at least four reflective areas, in each case two of the reflective areas being arranged with respect to one another in such a way that they retroreflect the light beam with an axial offset.

This refinement is suitable for the use of the delay module in the pulse multiplication or elongation module in particular when the beam splitter area or beam combining area is intended to coincide with the coupling-in area or the coupling-out area. In other words, the beam splitter area or the beam combining area can then be arranged between the two spherical mirrors and thus be integrated directly in the delay module.

In this connection, the optical arrangement may preferably have two 90° prisms whose in each case two catheti form the in each case two areas to be reflected, the prisms being arranged with their 90° angles facing one another, or the optical arrangement may equally also have a double retroprism through which the light beam passes twice, namely once on an outward path and once on a return path, the double retroprism being formed in such a way that the light beam is retroreflected on the outward path and the return path in each case With an axial offset.

The latter refinement of the optical arrangement with at least one double retroprism again has the advantage that the four reflective areas are integrated in a single component in fixed spatial assignment to one another, which once again minimizes the cost and adjustment outlay.

In all of the aforementioned preferred refinements, the at least two reflective areas are arranged in a plane outside a plane containing the axis of symmetry of the first and second mirrors.

In this case, it is advantageous that the light beam is folded between the two spherical mirrors along its delay distance in a plurality of planes and, as a result, the at least two reflective areas which are arranged in only one plane do not obstruct the beam path between the two spherical mirrors during multiple circulation of the light beam between the two mirrors.

Alternatively or cumulatively to the refinement of the optical arrangement with at least two reflective areas, it is likewise preferred for the optical arrangement to have at least two refractive areas through which the light beam is axially offset upon passing through.

In this case, it is particularly preferred for the optical arrangement to have at least four refractive areas, of which two opposite sides in each case are parallel to one another. By way of example and preferably, the four refractive areas may be the surfaces of a parallelogram-type prism, the light beam passing through said prism twice, the light beam being axially offset both times, the axial offset brought about in the course of passing through the first time being reversed in the course of passing through the second time.

The axial offset need not necessarily be the same for each passage of the light beam, but rather can be adapted when the delay module is used in the pulse multiplication or elongation module in such a way as to compensate for an offset through the beam splitter area, by way of example.

Furthermore, it is preferred for at least individual ones of the refractive areas to be arranged at the Brewster angle with respect to the light beam.

In this case, it is advantageous that reflection losses at the refractive areas are minimized, with the result that it is possible to dispense with reflection-reducing coatings of the refractive areas.

Furthermore, it is possible to realize a sequential arrangement of a plurality of optical arrangements with the just two spherical mirrors of the delay module. By way of example, given a mirror distance of 2 m, it is possible to realize an 8 m delay in combination with a 16 m delay with just two prisms, two beam splitters and the two spherical mirrors. In this way, by way of example, a 30 ns pulse can be elongated to more than 140 ms. By inserting further elements, even significantly greater delays or pulse elongations are possible solely by means of the two spherical mirrors. A plurality of pulse multiplication or elongation modules can also be used sequentially.

In this case, the entire arrangement can be accommodated in a compact tube having a small diameter that is only slightly larger than the diameter of the light beam.

The optical delay module according to the invention and/or the optical pulse multiplication or elongation module according to the invention is preferably used in a semiconductor lithography system for producing semiconductors.

Further advantages and features are apparent from the description below and the accompanying drawing.

It goes without saying that the features mentioned above and features yet to be explained below can be used not only in the respectively specified combination, but also in other combinations or by themselves, without departing from the scope of the present invention.

BRIEF DESCRIPTION OF DRAWINGS

Exemplary embodiments of the invention are illustrated in the drawing and are described in more detail hereinafter with reference thereto. In the figures:

FIGS. 2a) to d) show the delay module in FIG. 1 with an additional optical arrangement for beam transfer, FIG. 2a) showing the delay module in side view, FIG. 2b) showing the delay module in side view rotated through 90° relative to FIG. 2a) (plan view), FIG. 2c) showing the delay module in perspective and FIG. 2d) showing the delay module in cross section perpendicular to the axis of symmetry;

DETAILED DESCRIPTION OF PREFERRED EMBODIMENTS

Figure 1A:
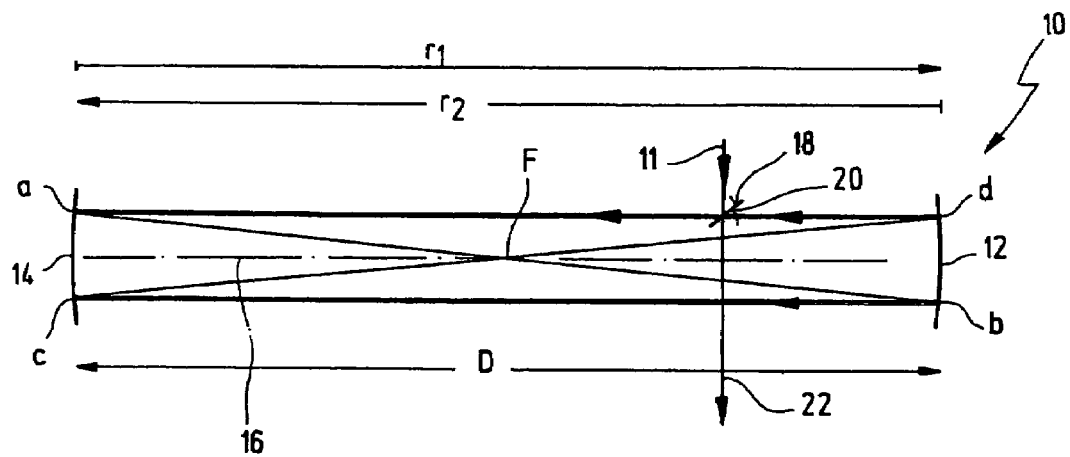
FIGS. 1a) to c) show an optical delay module as a basic module, FIG. 1a) showing the delay module with the beam path in side view, FIG. 1b) showing the delay module in perspective, and FIG. 1c) showing the delay module in section perpendicular to the axis of symmetry.

FIGS. 1a) to c) illustrate an optical delay module 10 for lengthening the propagation path of a light beam 11. The light beam 11 is generated for example by a laser (not illustrated).

The delay module has a first spherical mirror 12 and a second spherical mirror 14. The radii $r_1$ and $r_2$ of curvature of the mirrors 12 and 14 are identical.

The first mirror 12 and the second mirror 14 are arranged on a common axis 16 of symmetry with their concave sides situated opposite one another, to be precise at a mirror distance D corresponding to the radii $r_1$ and $r_2$ of curvature. The arrangement is thus a confocal or 4 f arrangement of the mirrors 12 and 14, with the result that this arrangement has the properties of a 1:1 imaging optic.

The delay module has a coupling-in area 18, which is completely reflective if the delay module is not intended to serve autonomously as pulse multiplication or elongation module. The coupling-in area 18 is formed for example by a mirror tilted by 45° with respect to the incident light beam 11.

The coupling-in area 18 serves for coupling the light beam 11 into the space between the first and second mirrors 12, 14.

Starting from the coupling-in area 18, the beam path is as follows. In a manner corresponding to the arrows depicted in FIG. 1a), the light beam 11 passes in the coupling-in area 18 to the location a at the second mirror 14, is reflected there and passes approximately through the focal point F to the first mirror 12 and is reflected there at the location b. From the location b, the light beam passes to the second mirror 14 again, is reflected there at the location c and once again passes approximately through the focal point F to the first mirror 12, where the light beam is then reflected at the location d. From there the light beam 11 passes to the rear side of the coupling-in area 18, which is formed in reflective fashion and serves as coupling-out area 20 for coupling the light beam 11 out of the space between the two mirrors 12 and 14. In accordance with arrow 22, the light beam 11 thus leaves the delay module 10 after four circulations, the coupled-out light beam 11 and the coupled-in light beam 11 lying on the same optical axis and having the same shape and cross-sectional area since the delay module 10, through the use of the spherical mirrors 12 and 14, images the coupling-in area 18 1:1 onto the coupling-out area 20. The propagation path of the light beam 11 has thus been lengthened in the delay module 10 by approximately quadruple the mirror distance d.

The delay module 10 may also be used as pulse multiplication or elongation module if the coupling-in area 18 is only partly reflective, so that the light beam 11 incident on the coupling-in area 18 is partly coupled into the delay module 10 and is partly transmitted. That partial beam of the light beam 11 which has then circulated four times between the mirrors 12 and 14 as described above is then combined with the incident light beam 11 at the coupling-out area 20, which then acts as beam combining area. In this way, light pulses of which the light beam 11 may be composed are elongated approximately four-fold or quadrupled, as a result of which the peak power of each individual pulse is reduced.

Figure 1B:
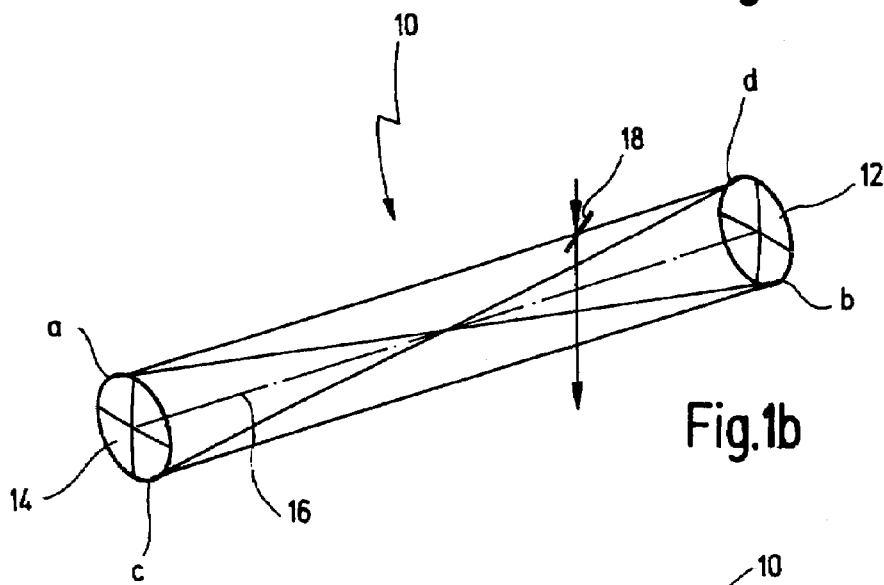
Figure 1C:
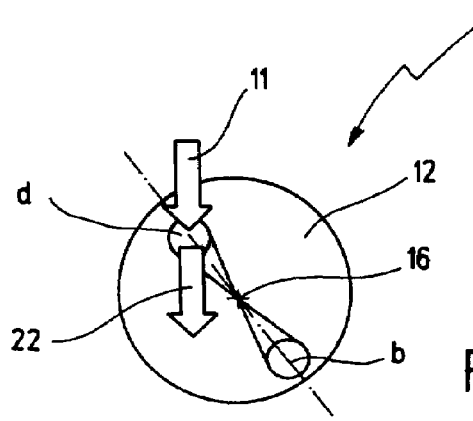

The illustration in FIG. 1c) shows that the light beam is reflected at the first mirror 12 at the two locations d and b, these two spots lying in a plane that passes through the axis 16 of symmetry. The same conditions are present at the mirror 14.

In the exemplary embodiments below, using the delay module 10, which may also be referred to as a basic module, a description is given of delay modules and pulse multiplication or elongation modules by means of which larger delay paths can be achieved.

For this purpose, optical arrangements are introduced between the mirrors 12 and 14, which transfer the light beam 11 between the mirrors 12 and 14 in such a way that the propagation path of the light beam 11 between the coupling-in area 18 and the coupling-out area 20 corresponds approximately to 2 N times mirror distance D, where N is an integer >2.

FIGS. 2a) to d) illustrate a delay module 30, which is based on the delay module 10 and has the mirrors 12 and 14 in accordance with the exemplary embodiment in FIG. 1.

Furthermore, the delay module 30 has an optical arrangement 32, which brings about the aforementioned beam transfer.

The optical arrangement 32 has two reflective areas 34 and 36, which are at an angle of 90° with respect to one another.

The reflective areas 34 and 36 are formed by the catheti of a 90° prism 38, but could also be replaced simply by two reflective mirrors arranged at 90° with respect to one another.

The two reflective areas 34 and 36 form a retroreflective arrangement.

The reflective areas 34 and 36 are arranged in a plane 40 arranged outside a plane containing the axis 16 of symmetry of the mirrors 12 and 14.

The coupling-in area 18 of the delay module 30 is formed by the rear side of the reflective area 34, and the coupling-out area 20 is formed by the rear side of the reflective area 36, with the result that the reflective areas 34 and 36 and also the coupling-in area 18 and 20 are all provided on just one optical component, namely the prism 38.

The beam path in the delay module 30 is as follows in accordance with FIG. 2c) (also cf. the arrows in FIG. 2a).

The incident light beam 11 is reflected at the coupling-in area 18 and passes to the location a at the first mirror 12. From the location a, the light beam passes to the diametrically opposite location b of the second mirror 14, is reflected there and passes to the opposite location c at the first mirror 12. From there the light beam is reflected to the location d at the second mirror 14. From there the light beam 11 passes to the reflective area 34, from there to the reflective area 36 and is correspondingly retroreflected with an axial offset. The light beam 11 is thus transferred in the plane 40, i.e. in a plane that does not pass through the axis 16 of symmetry of the mirrors 12 and 14. From the reflective area 36, the light beam passes to a location e at the second mirror 14, is reflected from there to a location f at the first mirror, and passes from there to a location g at the second mirror 14. From the location g, the light beam 11 passes to a location h, is once again reflected there and impinges on the coupling-out area 20, from which the light beam 11 then leaves the delay module 30.

By means of the optical arrangement 32, the light beam 11 is thus folded three-dimensionally in the delay module 30, that is to say that the light beam 11 impinges on the mirrors 12 and 14 at the locations a to h which do not lie on a straight line (cf. FIG. 2c), as is the case in the delay module 10 in FIG. 1.

With the delay module 30 in FIG. 2, the delay distance thus amounts to approximately eight times the mirror distance D.

By means of the arrangement—chosen in FIG. 2—of the prism 38 with the reflective areas 34 and 36 and the coupling-in area 18 and the coupling-out area 20, the light beam 11, during its multiple circulations between the mirrors 12 and 14, may pass the prism 38 partly unimpeded, as is apparent from FIGS. 2b) and 2d).

Figure 3A:
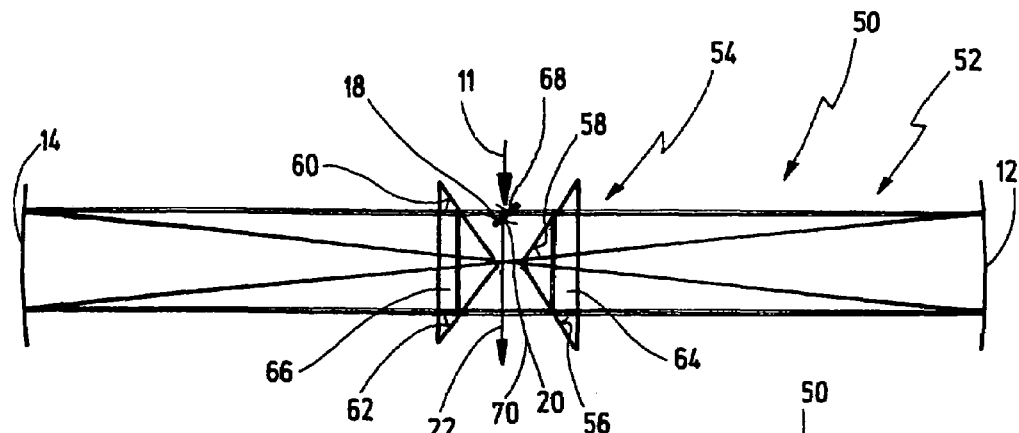
FIGS. 3a) to 3d) show a pulse multiplication or elongation module on the basis of the delay module in FIG. 1 with an optical arrangement for beam transfer that is modified relative to FIG. 2, FIGS. 3a), b), c) and d) corresponding to the views of FIGS. 2a), b), c) and d)

FIGS. 3a) to 3d) illustrate a pulse multiplication or elongation module 50, which is based on a delay module 52, the optical arrangement 54 of which is modified compared with the delay module 30 in FIG. 2.

The optical arrangement 54 of the delay module 52 has a total of four reflective areas 56, 58 and 60, 62.

The reflective areas 56 and 58 are at an angle of 90° with respect to one another, as are the reflective areas 60 and 62. The reflective areas 56 and 58 are formed by the catheti of a first prism 64, while the reflective areas 60 and 62 are formed by the catheti of a second prism 66.

At the pair of reflective areas 56 and 58 and also at the pair of reflective areas 60 and 62, the light beam 11 is in each case retroreflected with an axial offset.

Figure 3B:
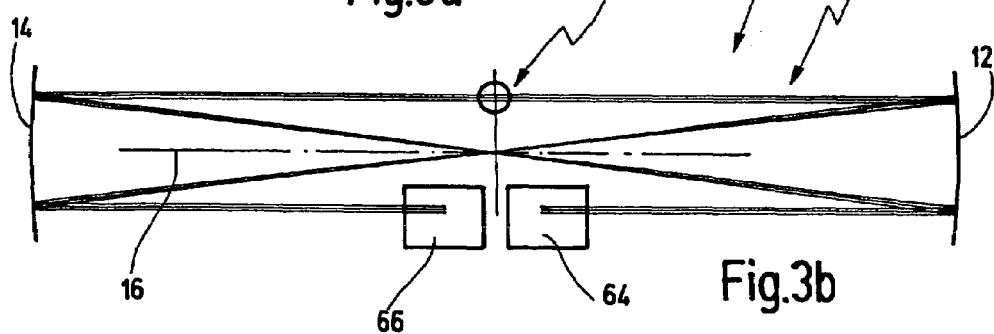

The two prisms 64 and 66 are arranged, in a manner similar to the exemplary embodiment in accordance with FIG. 2, in a plane lying outside the plane that contains the axis 16 of symmetry of the mirrors 12 and 14, as revealed in FIG. 3*b*).

The two prisms 64 and 66 are arranged in such a way that their 90° angles face one another, as revealed in FIG. 3*a*).

In the case of this exemplary embodiment, the coupling-in area 18 of the delay module 52 is formed by a beam splitter area 68, which partly couples the incident light beam 11 into the delay module 52 and partly transmits it without reflection at the mirrors 12 and 14 in accordance with arrow 22.

The coupling-out area 20 simultaneously forms a beam combining area 70. In this way, that partial beam which is delayed by multiple circulation in the delay module 52 is combined with the non-delayed partial beam in accordance with arrow 22 at the coupling-out location, the delayed partial beam and the non-delayed partial beam being identical with regard to shape and size because the mirrors 12 and 14 bring about a 1:1 imaging of the light beam at the beam splitter area 68 onto the beam combining area 70.

Figure 3C:
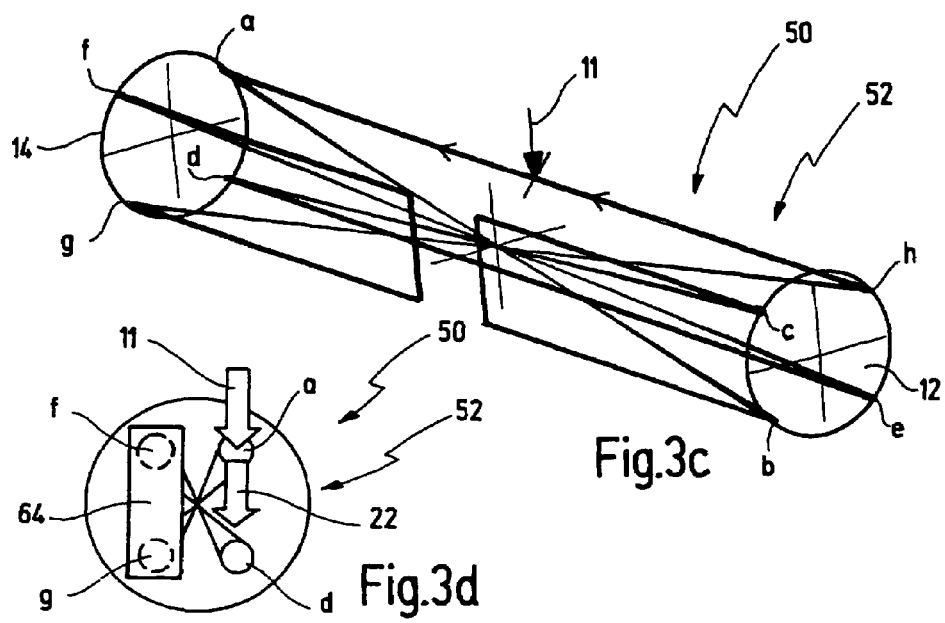
Figure 3D:

As is illustrated in FIG. 3*c*), the light beam 11 that is partly coupled into the delay module 52 passes from the beam splitter area 68 or coupling-in area 18, which coincide here, through the delay module 52 and is folded at the mirrors 12 and 14 in the order of the points a to h. At the coupling-out area 20 or beam combining area 70, the delayed partial beam is then coupled out of the delay module 52.

As in the case of the exemplary embodiment in accordance with FIG. 2, the delayed partial beam of the light beam 11 thus passes back and forth eight times between the mirrors 12 and 14 and correspondingly has a delay which approximately corresponds to eight times the mirror distance D between the mirrors 12 and 14.

In the case of the exemplary embodiments in accordance with FIGS. 2 and 3, the prism 38 and the prisms 64 and 66 are in each case arranged in such a way that their hypotenuses are perpendicular to the respective incident light beam 11, with the result that no refraction occurs at the hypotenuse. The hypotenuse may also be provided with reflection-reducing coatings in order to avoid light losses through undesirable reflection.

In this case, the reflection at the reflective areas 34, 36 and 56 to 62 may be based solely on total reflection, or the corresponding areas may also be provided with reflective coatings.

Figure 7:
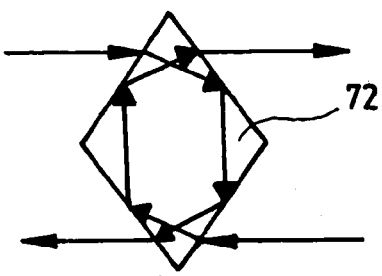
FIG. 7 shows a further optical arrangement for use in a delay module and pulse multiplication or elongation module in isolation.

Instead of the two individual prisms 64 and 66 in the exemplary embodiment in accordance with FIG. 3, it is also possible to use a single component, for example a double retroprism 72, illustrated in FIG. 7.

Figure 4A:
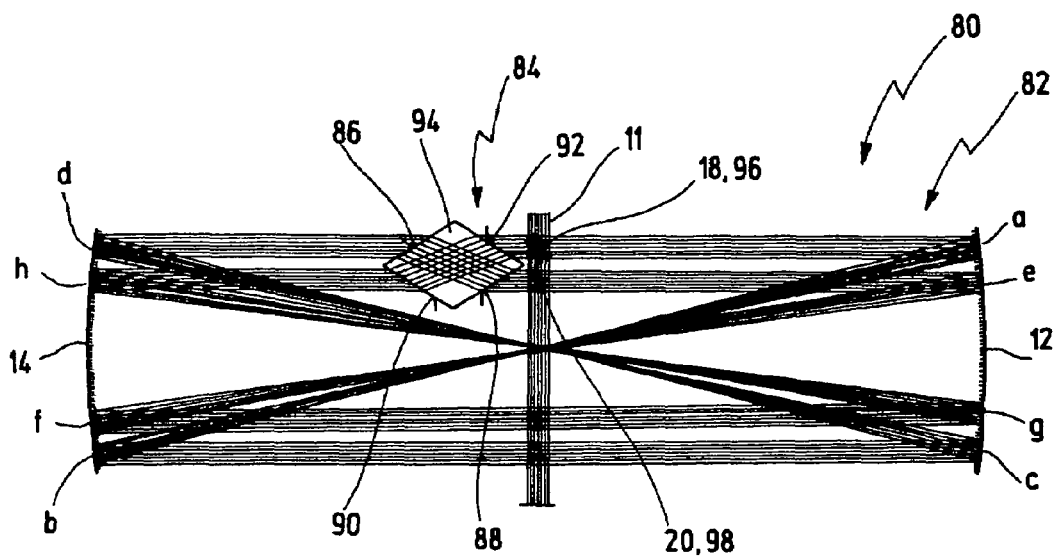
FIG. 4 shows a pulse multiplication or elongation module on the basis of the delay module in FIG. 1 with a further modified optical arrangement, FIG. 4a) being a side view and FIG. 4b) being a cross-sectional illustration perpendicular to the axis of symmetry.

FIG. 4 illustrates a further exemplary embodiment of a pulse multiplication or elongation module 80, which has a delay module 82, which is in turn based on the delay module 10 in FIG. 1 but differs from the previous exemplary embodiments by virtue of a modified optical arrangement 84.

The optical arrangement 84 has a plurality of refractive areas, four refractive areas 86, 88, 90, 92 in the exemplary embodiment shown.

The refractive areas 86 to 92 are formed by the surfaces of a rhombic prism 94, the tilting of the refractive areas 86 and 90, and 88 and 92, relative to the beam direction preferably corresponding to the Brewster angle, as a result of which reflection losses at the areas 86 to 92 can be minimized, and can even be precluded when using polarized light.

From the refractive areas 86 to 92, the areas 86 and 88 form a pair which axially offsets the light beam 11, but without altering the direction of propagation of the light beam 11, and the areas 90 and 92 likewise form an axially offsetting pair of refractive areas.

The pulse multiplication or elongation module 80 furthermore has a beam splitter area 96 and a beam combining area 98, which coincide with the coupling-in area 18 and the coupling-out area 20 as in the case of the previous exemplary embodiment.

Proceeding from the coupling-in area 18 or beam splitter area 96, a part of the coupled-in light beam 11 is coupled into the delay distance of the delay module 81. From the coupling-in area 18, the light beam 11 passes to the location a on the first mirror 12, is reflected there to the location b on the second mirror 14, from there to the location c on the first mirror, and from there to the location d on the second mirror 14. The light beam is then axially offset at the pair of refractive areas 86, 88, with the result that it initially does not impinge on the beam combining area 98, but rather passes to the location e on the first mirror 12, and is reflected from there to f on the second mirror 14, from there to the location g on the first mirror 12 and from there to the location h on the second mirror 14. From there the light beam passes through the pair of refractive areas 90 and 92 and is axially offset there into the original position again, and subsequently impinges on the coupling-out area 20 or beam combining area 98, with the result that the delayed partial beam is combined with the non-delayed partial beam of the light beam 11. Here as well, the delayed partial beam is unchanged relative to the non-delayed partial beam in respect of size and shape.

Figure 4B:
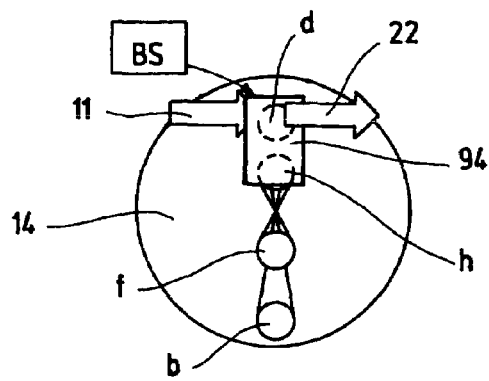

Given this choice of optical arrangement 84, the light beam 84, as illustrated in FIG. 4*b*), impinges on the mirrors 12 and 14 at the points a to h, that is to say on each mirror 12 and 14 at four locations (FIG. 4*b*) illustrates the points d, h, f, b on the second mirror 14) which lie on a straight line, that is to say that the beam folding in the delay module 82 is not three-dimensional, but rather only two-dimensional. In FIG. 4*b*) BS denotes the beam splitter area 96 or beam combining area 98.

Figure 6:
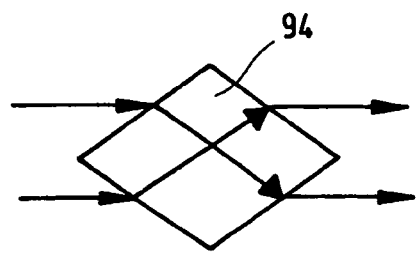
FIG. 6 shows the optical arrangement of the delay module in FIG. 4a) in isolation.

FIG. 6 illustrates the prism 94 in isolation.

Generally, optical arrangements which axially offset the light beam between the mirrors 12 and 14 without any change in direction or axially offset the light beam with a reversal of direction can be combined with one another in any desired arrangements. In this way, the entire mirror area of the spherical mirrors 12 and 14 can be used to delay the light beam by 2 N-fold folding. The three-dimensional folding in accordance with the exemplary embodiments in FIGS. 2 and 3 has the advantage in this case that a larger region of the mirror area of the mirrors 12 and 14 can be used for folding than in the case of two-dimensional folding.

Figure 5:
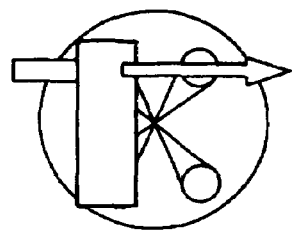
FIG. 5 shows an embodiment equivalent to FIG. 4 in a cross-sectional illustration perpendicular to the axis of symmetry.

FIG. 5 illustrates by way of example the three-dimensional equivalent to the beam folding in accordance with FIG. 4*b*).

Figure 8:
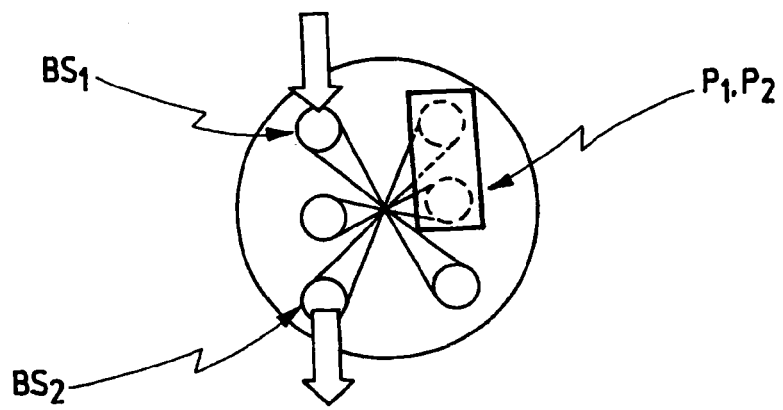
FIG. 8 shows a further embodiment of a delay module and pulse multiplication or elongation module in a cross-sectional illustration perpendicular to the axis of symmetry.

FIG. 8 furthermore illustrates as an example an optical arrangement for a pulse multiplication or elongation module in which a delay in accordance with FIG. 1 with four circulations is combined with a delay with eight circulations in accordance with FIG. 3. Consequently, the result is twelve circulations of the light beam between the just two mirrors 12 and 14, and the light beam is correspondingly reflected six times at each of the mirrors 12 and 14, as is illustrated with six spots in FIG. 8. Consequently, such a pulse multiplication or elongation module merely requires the two mirrors 12 and 14, two beam splitters $BS_1$ and $BS_2$ and, by way of example two prisms $P_1$, $P_2$. In this way, by way of example, a 30 ns pulse can be elongated to more than 140 ns. By inserting further optical elements, significantly greater delays or pulse elongations are also possible with one and the same module comprising the mirrors 12 and 14.

Figure 9:
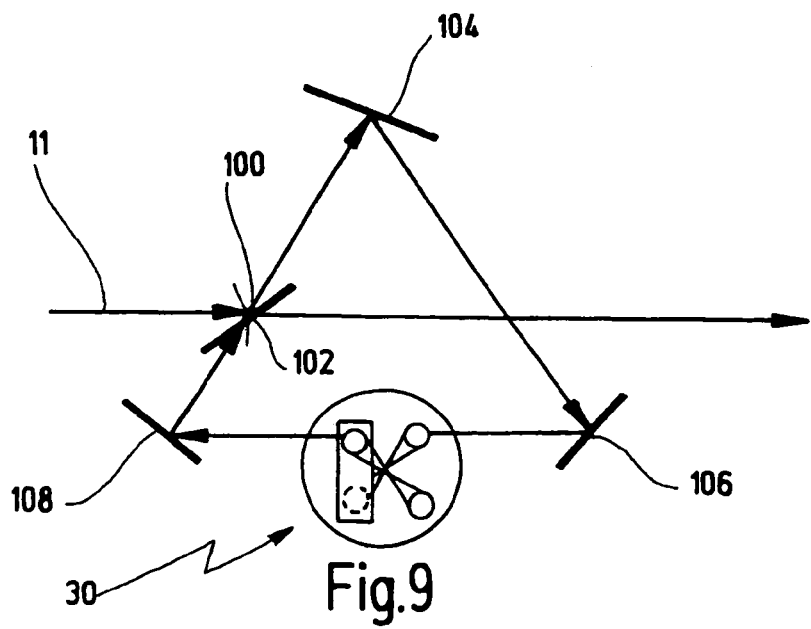
FIG. 9 shows a pulse multiplication or elongation module comprising a combination of a delay module and an external beam splitter device.

Whereas in the case of the exemplary embodiments in accordance with FIGS. 3 and 4 the beam splitters and beam combiners are integrated in the delay module, it is also possible, however, in accordance with FIG. 9, to combine a pure delay module, for example the delay module 30 in FIG. 2, with an external beam splitter area 100 and an external beam combining area 102. In accordance with FIG. 9, it is possible for example to combine the delay line described in the document EP 1 069 453 A2, the content of which is expressly incorporated by reference here, with additional mirrors 104 to 108 with the delay module 30 in FIG. 2, the latter then not having a dedicated beam splitter device.

What is claimed is:

1. An optical delay module for lengthening the propagation path of a light beam, comprising:
    a first spherical mirror and a second spherical mirror, said first spherical mirror and said second spherical mirror having equal radii of curvature, a common axis of symmetry passing through a center of each said first and second mirrors and where each of said first and second mirrors are symmetric about said axis; each of said first and second mirrors being situated opposite one another at a mirror distance from one another which corresponds to said radii of curvature of said first and second mirrors;
    a coupling-in area for coupling said light beam into a space between said first and second mirrors, and a coupling-out area for coupling the light beam out of said space between said first and second mirrors, said propagation path of said light beam between said coupling-in area and said coupling-out area corresponding at least approximately to quadruple said mirror distance;
    at least one optical arrangement arranged between said first and second mirrors, said optical arrangement being arranged to transfer said light beam without masking out of beam parts between said first and second mirrors in such a way that said propagation path of said light beam between said coupling-in area and said coupling-out area corresponds approximately to 2N times said mirror distance, where N is an integer >2.

2. The optical delay module of claim 1, wherein said optical arrangement transfers said light beam in such a way that said light beam is reflected at said first and said second mirror at in each case at least three different locations.

3. The delay module of claim 1, wherein said optical arrangement transfers said light beam in such a way that said light beam is reflected at said first and second mirror at least three different locations which lie in a common plane.

4. The delay module of claim 1, wherein said optical arrangement transfers said light beam in such a way that said light beam is reflected at each mirror at at least three different locations which do not lie on a straight line.

5. The delay module of claim 1, wherein said optical arrangement transfers said light beam at least once with reversal of a propagation direction of said light beam in an axially offset manner.

6. The delay module of claim 1, wherein said optical arrangement transfers said light beam at least once with maintenance of a propagation direction in an axially offset manner.

7. The delay module of claim 1, wherein said optical arrangement has at least two reflective areas which are arranged relative to one another in such a way that said light beam is retroreflected with an axial offset.

8. The delay module of claim 7, wherein said at least two reflective areas are at an angle of approximately 90° with respect to one another.

9. The delay module of claim 1, wherein said optical arrangement has at least one 90° prism whose two catheti have reflective areas.

10. The delay module of claim 9, wherein said hypotenuse of said prism is perpendicular to said light beam when being incident on and emerging from said prism.

11. The delay module of claim 1, wherein said optical arrangement has at least two reflective areas which are arranged relative to one another in such a way that said light beam is retroreflected with an axial offset, and wherein said at least two reflective areas are formed by at least two mirrors.

12. The delay module of claim 1, wherein said optical arrangement has at least two reflective areas which are arranged relative to one another in such a way that said light beam is retroreflected with an axial offset, and wherein said coupling-in area is formed by a rear side of one reflective area of said optical arrangement.

13. The delay module of claim 1, wherein said optical arrangement has at least two reflective areas which are arranged relative to one another in such a way that said light beam is retroreflected with an axial offset, and wherein said coupling-out area is formed by a rear side of said at least one second reflective area of said optical arrangement.

14. The delay module of claim 1, wherein said optical arrangement has at least four reflective areas, in each case two of said reflective areas being arranged with respect to one another in such a way that they retroreflect said light beam with an axial offset.

15. The delay module of claim 14, wherein said optical arrangement has at least two 90° prisms whose in each case two catheti form said in each case two reflective areas, said prisms being arranged with their 90° angles facing one another.

16. The delay module of claim 14, wherein said optical arrangement has at least one double retro prism which is formed in such a way that said light beam is retroreflected on an outward path and a return path in each case with an axial offset.

17. The delay module of claim 1, wherein said optical arrangement has at least two reflective areas which are arranged relative to one another in such a way that said light beam is retroreflected with an axial offset, and wherein said at least two reflective areas are arranged in a plane outside a plane containing said common axis of symmetry of said first and second mirrors.

18. The delay module of claim 1, wherein said optical arrangement has at least two refractive areas through which said light beam is axially offset upon passing through.

19. The delay module of claim 1, wherein said optical arrangement has at least four refractive areas, of which two areas in each case are parallel to one another.

20. The delay module of claim 19, wherein said at least two refractive areas are arranged at the Brewster angle with respect to said light beam.

21. An optical pulse multiplication or elongation module, having at least one beam splitter area, and having at least one beam combining area, and further comprising at least one optical delay module, said at least one optical delay module comprising
    a first spherical mirror and a second spherical mirror, said first spherical mirror and said second spherical mirror having equal radii of curvature, a common axis of symmetry passing through a center of each said first and second mirrors and where said first and second mirrors are symmetric about said axis; each of said first and second mirrors being situated opposite one another at a mirror distance from one another which corresponds to said radii of curvature of said first and second mirror;

a coupling-in area for coupling said light beam into a space between said first and second mirrors, and a coupling-out area for coupling the light beam out of said space between said first and second mirrors, said propagation path of said light beam between said coupling-in area and said coupling-out area corresponding at least approximately to quadruple said mirror distance;

at least one optical arrangement arranged between said first and second mirrors, said optical arrangement being arranged to transfer said light beam without masking out of beam parts between said first and second mirrors in such a way that said propagation path of said light beam between said coupling-in area and said coupling-out area corresponds approximately to 2N times said mirror distance, where N is an integer >2.

22. The pulse multiplication or elongation module of claim 21, wherein said at least one beam splitter area and said at least one beam combining area essentially coincide.

23. The pulse multiplication or elongation module of claim 21, wherein said at least one beam splitter area coincides with said coupling-in area and said at least one beam combining area coincides with said coupling-out area.

24. The pulse multiplication or elongation module of claim 21, wherein at least one of said at least one beam splitter area and said at least one beam combining area is separated from at least one of said coupling-in area and said coupling-out area.

25. A semiconductor lithography system, comprising an optical delay module for lengthening the propagation path of a light beam, comprising a first spherical mirror and a second spherical mirror, said first spherical mirror and said second spherical mirror having equal radii of curvature, a common axis of symmetry passing through a center of each said first and second mirrors and where each of said first and second mirrors are symmetric about said axis; each of said first and second mirrors being situated opposite one another at a mirror distance from one another which corresponds to said radii of curvature of said first and second mirror;

a coupling-in area for coupling said light beam into a space between said first and second mirrors, and a coupling-out area for coupling the light beam out of said space between said first and second mirrors, said propagation path of said light beam between said coupling-in area and said coupling-out area corresponding at least approximately to quadruple said mirror distance;

at least one optical arrangement arranged between said first and second mirrors, said optical arrangement being arranged to transfer said light beam without masking out of beam parts between said first and second mirrors in such a way that said propagation path of said light beam between said coupling-in area and said coupling-out area corresponds approximately to 2N times said mirror distance, where N is an integer >2.

26. A semiconductor lithography system, comprising an optical pulse multiplication or elongation module, having at least one beam splitter area, and having at least one beam combining area, further comprising at least one optical delay module, said optical delay module comprising a first spherical mirror and a second spherical mirror, said first spherical mirror and said second spherical mirror having equal radii of curvature, a common axis of symmetry passing through a center of each said first and second mirrors and where each of said first and second mirrors are symmetric about said axis; each of said first and second mirrors being situated opposite one another at a mirror distance from one another which corresponds to said radii of curvature of said first and second mirror;

a coupling-in area for coupling said light beam into a space between said first and second mirrors, and a coupling-out area for coupling the light beam out of said space between said first and second mirrors, said propagation path of said light beam between said coupling-in area and said coupling-out area corresponding at least approximately to quadruple said mirror distance;

at least one optical arrangement arranged between said first and second mirrors, said optical arrangement being arranged to transfer said light beam without masking out of beam parts between said first and second mirrors in such a way that said propagation path of said light beam between said coupling-in area and said coupling-out area corresponds approximately to 2N times said mirror distance, where N is an integer >2.

* * * * *

UNITED STATES PATENT AND TRADEMARK OFFICE
CERTIFICATE OF CORRECTION

PATENT NO. : 7,486,707 B2
APPLICATION NO. : 11/013189
DATED : February 3, 2009
INVENTOR(S) : Alois Herkommer et al.

Page 1 of 1

It is certified that error appears in the above-identified patent and that said Letters Patent is hereby corrected as shown below:

Title Page; should read;

(54) Optical Delay Module for Lengthening the Propagation Path of a Light Beam and Pulse Multiplication or Elongation Module Signed and Sealed this Fifth Day of May, 2009

JOHN DOLL
*Acting Director of the United States Patent and Trademark Office*

UNITED STATES PATENT AND TRADEMARK OFFICE
CERTIFICATE OF CORRECTION

PATENT NO.        : 7,486,707 B2  
APPLICATION NO.   : 11/013189  
DATED             : February 3, 2009  
INVENTOR(S)       : Alois Herkommer et al.

Page 1 of 1

It is certified that error appears in the above-identified patent and that said Letters Patent is hereby corrected as shown below:

Title Page, Item (54) and Column 1, lines 1-5 should read;

Optical Delay Module for Lengthening the Propagation Path of a Light Beam and Pulse Multiplication or Elongation Module This certificate supersedes the Certificate of Correction issued May 5, 2009.

Signed and Sealed this

Twenty-sixth Day of May, 2009

JOHN DOLL  
*Acting Director of the United States Patent and Trademark Office*